United States Patent
Jadcherla et al.

(10) Patent No.: US 7,694,241 B1
(45) Date of Patent: Apr. 6, 2010

(54) AUTOMATED DESIGN PROCESS AND METHOD FOR MULTI-RAIL CELLS AND CONNECTIONS

(75) Inventors: Srikanth Jadcherla, Campbell, CA (US); Sriram Kotni, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 859 days.

(21) Appl. No.: 11/313,969

(22) Filed: Dec. 20, 2005

(51) Int. Cl.
*G06F 17/50* (2006.01)

(52) U.S. Cl. .................. 716/1; 716/12; 716/16
(58) Field of Classification Search .......... 716/12, 716/1, 16
See application file for complete search history.

(56) References Cited

U.S. PATENT DOCUMENTS

| | | | |
|---|---|---|---|
| 5,953,519 A * | 9/1999 | Fura | 716/18 |
| 6,083,271 A * | 7/2000 | Morgan | 716/1 |
| 6,925,627 B1 * | 8/2005 | Longway et al. | 716/13 |
| 2005/0108667 A1 * | 5/2005 | Iadanza et al. | 716/4 |
| 2005/0120321 A1 * | 6/2005 | Auracher et al. | 716/8 |
| 2005/0257179 A1 * | 11/2005 | Stauffer et al. | 716/3 |
| 2005/0278676 A1 * | 12/2005 | Dhanwada et al. | 716/9 |
| 2006/0085770 A1 * | 4/2006 | Kapoor et al. | 716/4 |
| 2006/0184905 A1 * | 8/2006 | Floyd et al. | 716/5 |
| 2007/0044044 A1 * | 2/2007 | Wilson et al. | 716/1 |
| 2008/0098338 A1 * | 4/2008 | Kapoor et al. | 716/5 |

* cited by examiner

*Primary Examiner*—Paul Dinh
*Assistant Examiner*—Suchin Parihar
(74) *Attorney, Agent, or Firm*—Park, Vaughan & Fleming LLP

(57) ABSTRACT

Automated design process and method with set of syntactic elements compensates for inability to represent voltage island connection of multi-rail cells in RTL source files in traditional design process which inhibits development of design automation methods and causes hardship and risk of failure to simulate, synthesize, perform physical design or formally verify a semiconductor chip design implemented with multi-rail.

16 Claims, 5 Drawing Sheets

US 7,694,241 B1

AUTOMATED DESIGN PROCESS AND METHOD FOR MULTI-RAIL CELLS AND CONNECTIONS

BACKGROUND

1. Field

Invention relates to electronic design automation (EDA), particularly to automated design process and method for semiconductor chip implemented with multi-rail cells, wherein multi-rail circuit and logic design employ multi-VDD, back bias, sleep transistors, retention grids, etc.

2. Related Art

In semiconductor chip design, tools commonly classified as electronic design automation (EDA) software are used to provide means for automating design of Integrated Circuits (IC) and Systems on Chip (SoC). Tools are also used to provide means of automating task(s) of preparing design for manufacture on silicon.

Moreover Hardware Description Languages (HDL) are used to model semiconductor chip and functions. Existing HDL technology places main function description of IC and SoC in Register Transfer Language (RTL) source files.

RTL files do not include information about various "non-functional" aspects of the design. One of such "non-functional" aspects is voltage island connection of multi-rail cells wherein multi-rail circuit and logic design employ multi-VDD, back bias, sleep rails, retention grids, etc. Such inability to represent such an architectural choice of voltage elements in RTL inhibits development of design automation methods. Hence, it is not possible to simulate, synthesize, perform physical design or formally verify semiconductor chip design implemented with multi-rail cells without hardship and risk of failure. Voltages are often key functionality factors; and treating them as "non-functional" is thus problematic. Accordingly, there is need for improved design process and method.

SUMMARY

Automated design process and method with a set of syntactic elements compensates for inability to represent voltage island connection of multi-rail cells in RTL source files. In embodiment of invention, set of syntactic elements is included in RTL source file of semiconductor chip design. The set of syntactic elements accomplishes partitioning of design description along voltage island connections in RTL source file. Syntactic elements can be included with initial creation of RTL source file and via incremental edit through command sequence or Graphical User Interface (GUI).

Automated design process comprises steps of creating RTL source file including set of syntactic elements for voltage island connections of multi-rail cells, processing RTL source file according to effect of voltage island connections of multi-rail cells, and generating modified design output that communicates between design process steps, wherein design process steps comprises parsing, RTL simulation, synthesis, gate level simulation, formal verification, as well as physical design and verification, and others as needed.

DETAILED DESCRIPTION

As used herein multi-rail cell is defined cell that has multiple voltage connections, other than power/ground connection. In CMOS there is driving voltage connection per transistor; driving voltage being defined as voltage that can charge/discharge output load of CMOS gate. Nevertheless cell may be coupled to other voltages connections such as retention, sleep, body bias, etc., which can alter circuit behavior and ability to charge/discharge output load. Such voltage connections do not often directly drive output of gate, i.e., provide current to charge/discharge output.

Figure 1:
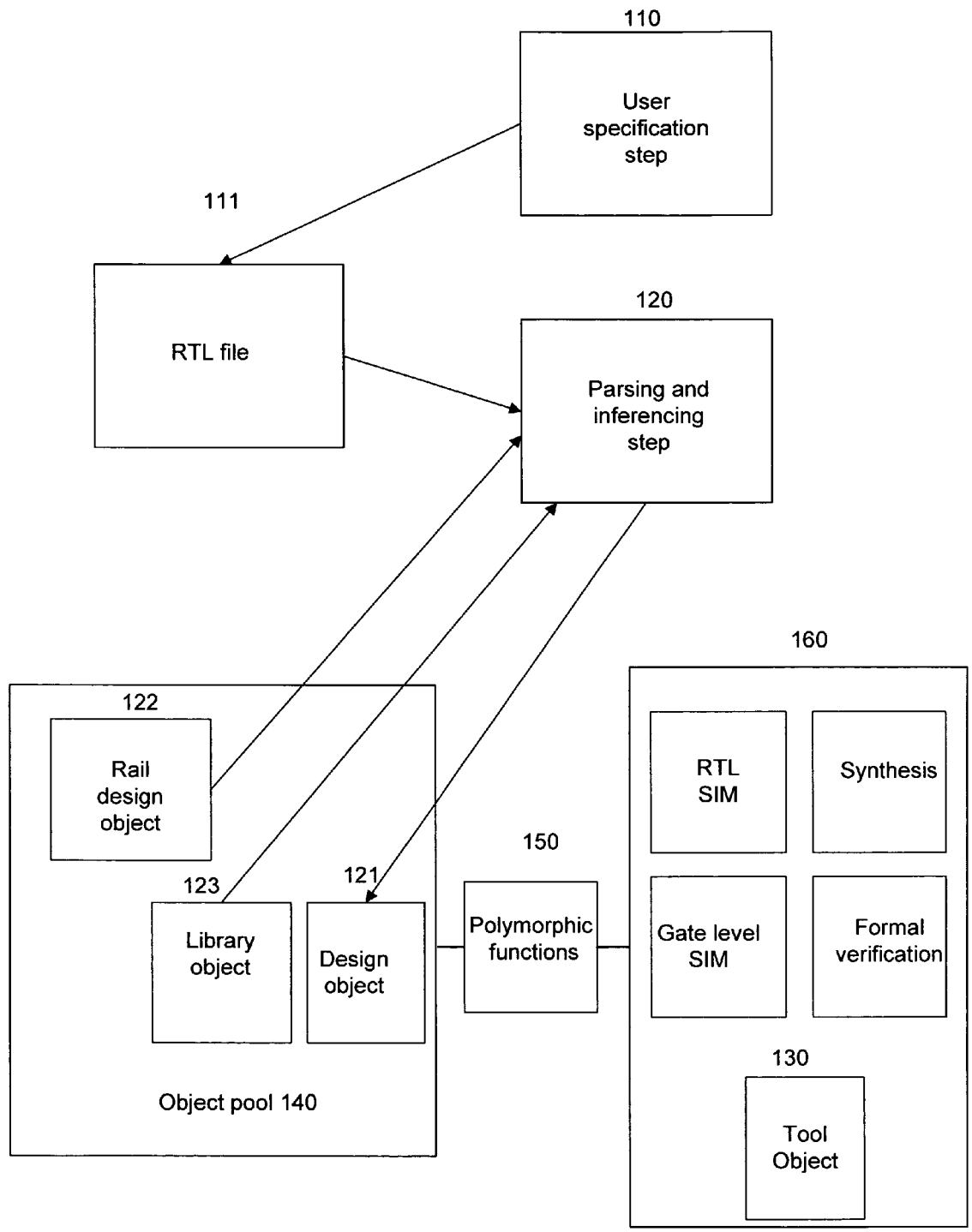
FIG. 1 is operational process flow chart showing automated design process in accordance with embodiment of invention.

FIG. 1 operational process flow chart for automated design process comprises user specification step 110 that creates RTL file 111, parsing and/or inference step 120 that creates design object 121, and other implementation and/or verification steps 160. Parsing and inference step 120 creates design object 121 based on rail design object 122, library object 123, tool object 130 and/or object pool 140. Other implementation and/or verification steps interact with object pool 140 via polymorphic functions 150. At inferencing 120, virtual cell may be marked with polymorphic function or a library cell marked with polymorphic function. Depending on operational process phase of design such as simulation, or synthesis etc., appropriate function can be called. Information about design object, rail design object, tool object and/or object pool can be found in following US applications which are incorporated herein by reference: U.S. application 60/589,403 "Automated Design Process and Chip Description System" and US application 60/589,330 "Automated Multiple Voltage/Power State Design Process and Chip Description System".

Figure 3:
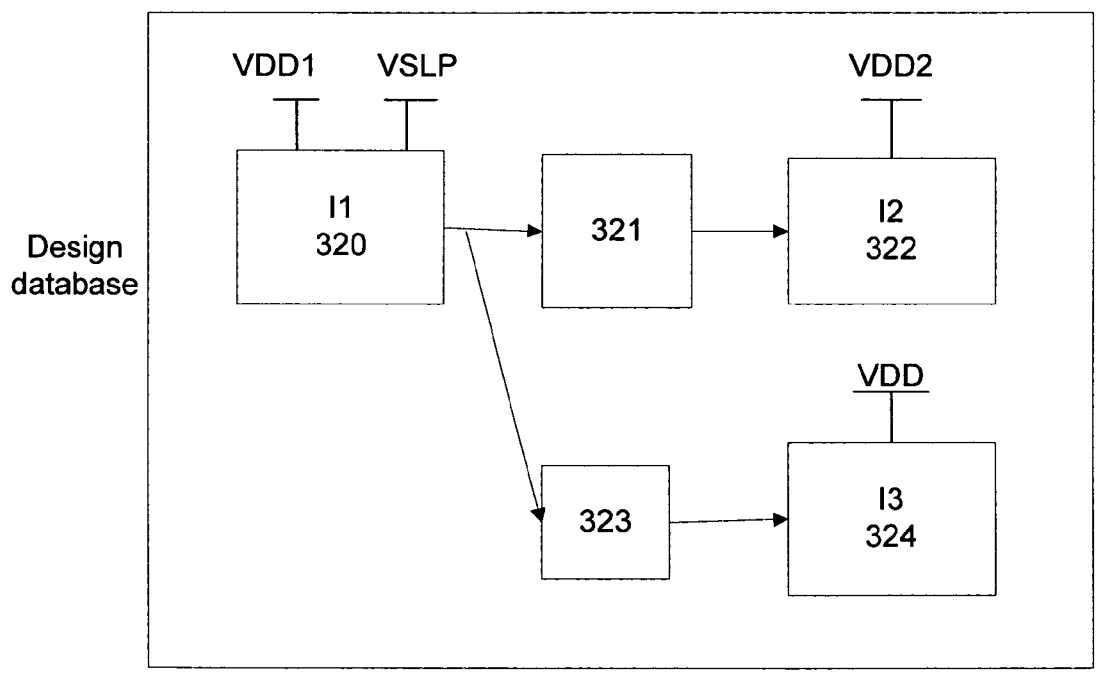
FIG. 3 is example of section of RTL or ESL description of design in accordance with embodiment of invention.

Example of RTL file 111 is shown in FIG. 3, which includes section of RTL or ESL description of sample design. There are three sets of syntactic elements. The first set begins with an initial identifier 310 "Begin_Apd_Power_Domain" and final identifier 312 "End_Apd_Power_Domain" incorporates multiple voltage connections VDD1 and VSLP. These voltage connections VDD1 and VSLP are applied to AND design object 311 with output A1 and inputs B1 and C1. Second set begins with initial identifier 313 "Begin_Apd_Power_Domain" and final identifier 315 "End_Apd_Power_Domain" incorporates multiple voltage connections VDD2. Voltage connection VDD2 is applied to AND design object 314 with output A2 and inputs A1 and C2. Third set does not have initial and final identifier, implies implicit power domain markings, and has INV design object 316 with output A3 and input A2. Output of design object 311 is coupled to one of inputs of design object 314, and this coupling may cross power domains. Similarly output of design object 314 is coupled to input of design object 316, and this coupling crosses power domains. These syntactic elements are taken by compiler and generate multi-rail cell or virtual cell design object 321 and 323 with appropriate polymorphic functions on crossover signal objects A1 and A2 respectively. Without loss of generality section can contain one or more instances of library cell on crossover signal object in this example A1 and A2, then compiler attaches polymorphic function to instances of library cell, not shown. In FIG. 1 parsing and inference step 120 processes RTL lines in sections and generates multi-rail cell or virtual cell design object 121 in object pool 140.

Note whenever used herein term including "power_domain" may instead use or swap thereof functionally equivalent "multi voltage_island" term, without affecting operation.

Comma-separated words after key word "Begin_Apd_Power_Domain" followed by character ":" identify rails (i.e., voltage nets) coupled to this section. In one embodiment of invention these rails (i.e., voltage nets) can be described in accordance with Object descriptions disclosed in U.S. application 60/589,403 "Automated Design Process and Chip Description System" and U.S. application 60/589,330 "Automated Multiple Voltage/Power State Design Process and Chip Description System" as incorporated herein. Properties of such voltage nets include special circuit effects and are derived from respective object descriptions. As defined herein, term "multi-rail" is understood broadly to mean and apply to any logic, circuit, cell, or equivalent functionality wherein multiple voltage connections, as well as power/ground connection, are embodied. For example, in CMOS process and design, driving voltage connection is provided per transistor, thus providing two or more driving voltage connections per CMOS gate.

As defined herein term "driving voltage" is understood broadly to mean and apply to any signal for charge/discharge of output load of a logic, circuit, or cell gate. In FIG. 3, VDD is an example of driving voltage. In addition such logic, circuit, or cell gate may be coupled to other signals or voltages such as retention, sleep, body bias, etc. collectively called non-driving rails, which can alter behavior of such logic, circuit, or cell gate, particularly ability to charge/discharge output load. Such voltage connections may not directly couple output of gates, i.e., to provide current for output charge/discharge. In FIG. 3, VSLP is example of non-driving rail.

Example in FIG. 3 shows INV design object 316 with output A3 and input A2 that is coded without rail marking. In this case voltage connections are implicit. Process in FIG. 1 translates INV design object to set of design objects 340, 341 and 342, i.e., applying implicit rail (i.e., voltage net) VDD to INV design object.

Syntactic elements used in this example to mark design blocks as power domain are copyrighted. These syntactic element examples are not necessarily the only syntactic element possible; any uniquely identifiable syntactic element may be used.

Without loss of generality, while syntactic elements and/or constructs may be reproduced in other form, ability to identify portion of RTL file and translate RTL expression to proper multi-rail connections for any design process step is provided.

Furthermore without loss of generality, these syntactic elements and/or constructs can be applied to Electronic System Level description (ESL), Gate Level netlist description or other design description at appropriate abstraction level.

Figure 4:
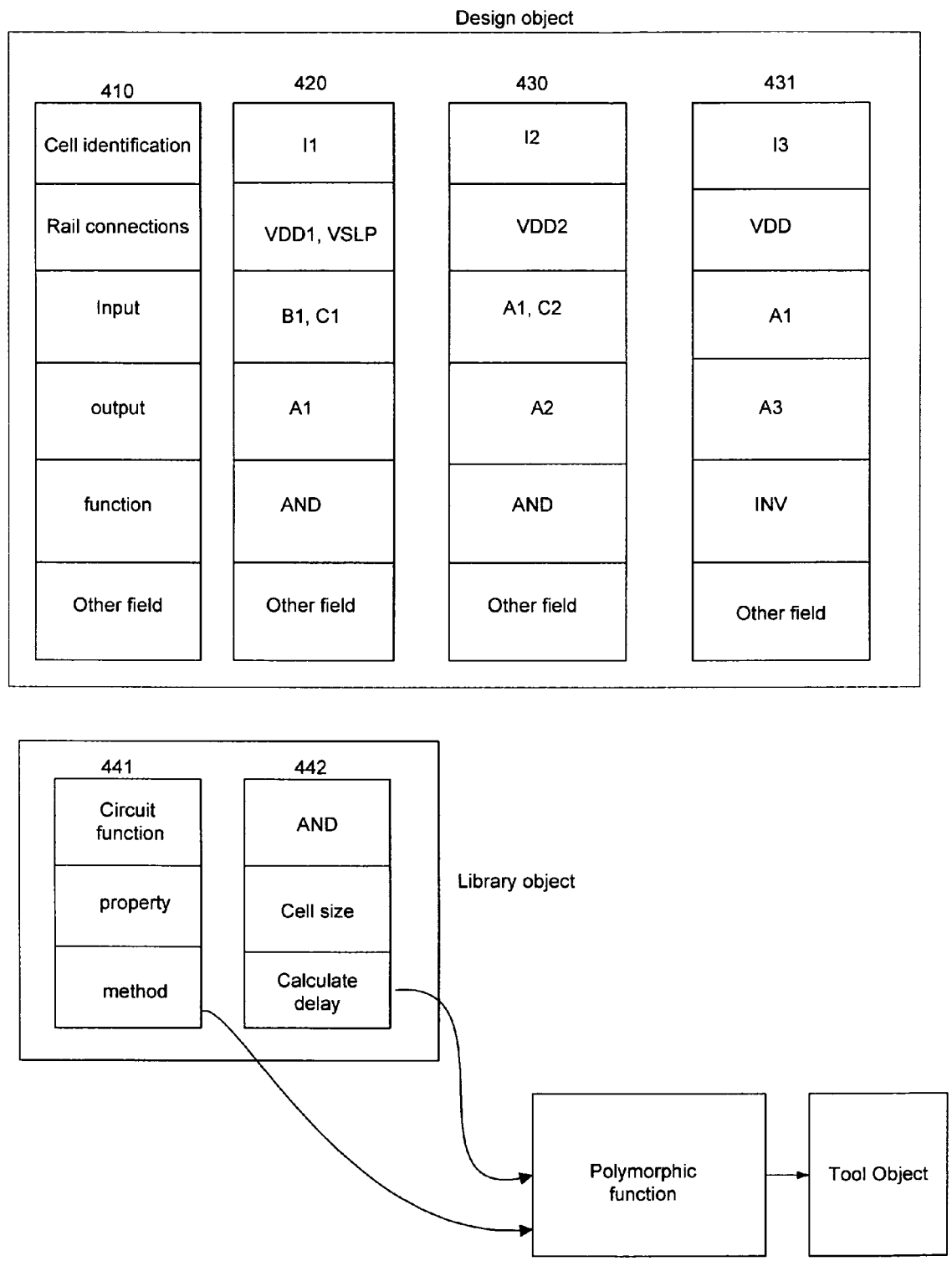
FIG. 4 is block diagram showing example of design object and library object in object pool in accordance with embodiment of invention.

FIG. 4 illustrates examples of design object 121 and library object 123 in object pool 140. Generic design object 410 comprises storage elements cell identification, rail connections, input, output, function, and other fields. Design object 420 has name I1, multi-rail connections VDD1 and VSLP, inputs B1 and C1, and output A1. Multi-rail connections VDD1 and VSLP are coupled automatically as illustrated with FIG. 3. Design object 430 has name I2, inputs A1 and C2, and output A2. Design object 431 has name I3, input A2 and output A3. There is only implicit VDD connection to rail voltage as illustrated with FIG. 3. Generic library object 441 comprises storage elements function, property and method. Library object 442 is example of AND library cell.

Multi-rail voltage networks to be coupled to design objects throughout object pool are deduced from either multi-rail voltage text constructs or similar markers embedded in RTL or hierarchical unit based association in text or graphical command interface. Supporting such inference needs method to select appropriate library cell for each function represented by statements or blocks of logic that can be translated to cells or gate-level representation of cells as described in FIG. 1. Object-oriented view of library may be used. Hence inference step invokes library object cell return method with corresponding multi-rail voltage list of each section and required function represented by statements or blocks of logic that can be translated to cells or gate-level representation of cells inside section. Alternative to cell return method in object oriented view of library, procedural program may be written to analyze library and select appropriate cell.

In accordance with embodiment of invention, rail design object or multi-rail voltage net design object comprises polymorphic function elements which can be called upon to execute different actions depending on the specific design process step. For example first function element can be called upon during simulation to supply simulator with simulation models/behaviors. Second function element can be called during synthesis to return appropriate cells for mapping, providing delay calculation support, insert level shifter or isolator between different voltage islands, etc. Third function element can be called upon during placement and routing step to ensure cell placed correctly in area with required rails and routed with correct hook ups. Fourth function element can be called upon during test to ensure that possible faults are testable and that test equipment can handle such multi-rail test. Each tool of these examples of simulation, synthesis, placement and routing, and test are modeled as tool object with polymorphic function in object pool having corresponding connection to rail design objects illustrated in FIG. 2 so that polymorphic function element of each rail design object can be called. Example in FIG. 4 shows a connection from library object 442 to tool object polymorphic function. This coupling allows various tools to verify multi-rail connections specified by user is consistent with characteristic of selected library elements.

Figure 2:
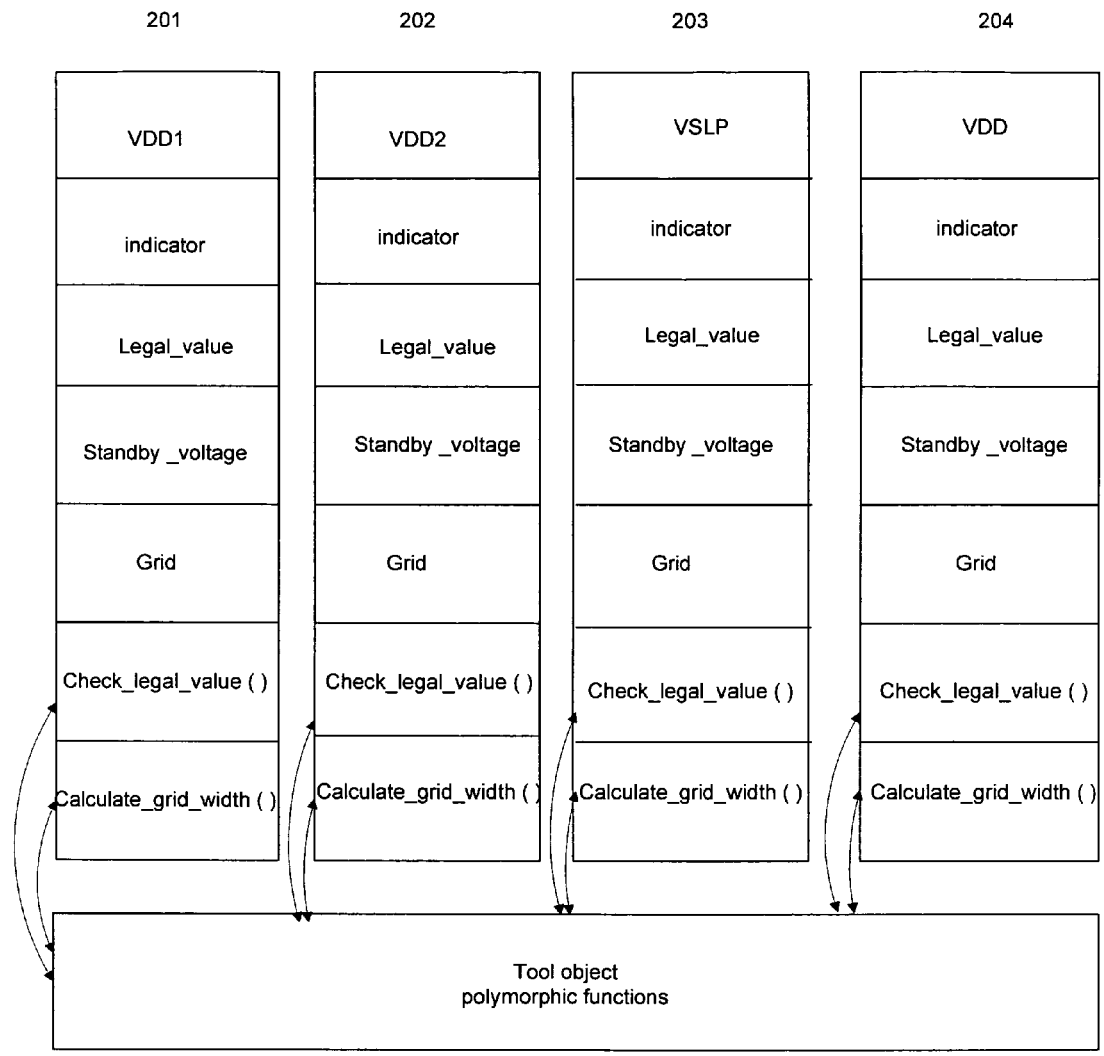
FIG. 2 is block diagram showing example of rail design objects in object pool in accordance with embodiment of invention.

Example of polymorphic function elements 205 is shown in FIG. 2. For cell with multi-rail connections VDD and VSLP such as cell 321 in FIG. 3, polymorphic function calls methods VDD.check_legal_values and VSLP.check_legal_values when simulator is running. When physical design tool is running, same polymorphic function calls methods VDD.calculate_grid_width and VSLP.calculate_transition. Cell 320 in FIG. 3 does not get benefit of this function. Syntax in this example uses rail design object name concatenated with method name with period as separator to identify uniquely rail design object to which method pertains.

Function that cell is marked with is polymorphic, i.e., it can be called to execute different actions depending on phase of design and design process at that time. For instance, during simulation phase, function supplies simulator with appropriate simulation models/behaviors. During synthesis, function returns cells for mapping, provide delay calculation support, etc. During placement and routing, function ensures that cell placed correctly in area with required rails and routing ensures that hook ups are correct. During test, function ensures that possible faults are testable, and test equipment can handle such multi-rail test.

In this example, knowledge of which methods polymorphic function should call is programmed into multi-rail design object. Software design may choose to incorporate it in other part of program or data structure. A generic scheme is given to user, where user can customize and expand it. For example, user may add methods or fields in addition to example of check_legal_values and calculate_grid_width presented here.

Previous discussion can be illustrated by representative Inference/Parsing pseudocode:

Inference And Parsing:

Repeat (on all source code)
   Read source code statement
   If statement is (Begin Power Domain . . . )
   Mark beginning of new section
   Read rail list after Begin Power Domain and store them for this section
   Check rail list to ensure all rails listed are declared.
   If statement is regular line of source code
   Convert statement to black box (input output view) virtual cell
   Connect stored rails to virtual cell in database
   Call Library_cell_return_function with virtual cell and rails as inputs
   Connect the returned cell to the rails
   If no cell is returned, indicate an error to the user
   If no rails are stored, mark rails as VDD, GND.
   If statement is (End Power Domain.)
   Mark end of section
   Remove temporary storage of rail information The cell_return_function of the library can be described as follows:

Foreach (cell) in Library
   See if input set of rails can be connected to cell
   If so, see if cell function matches virtual cell function
   If so, return (cell)
   If multiple matches are found, use area, delay, power or other user specified metric to decide. If no user specified metric exists or can be deduced, use lowest area cell Alternately, virtual cell function can be matched first before set of rails. This potentially speeds-up process. However based on library contents, this may result in error. Hence above pseudocode may be safer to use.

Without loss of generality, there are other ways to organize this partition of parsing and inference step, design process steps and tasks as implementation choices. Ability to identify and translate RTL expression to proper multi-rail connections for design process step is provided.

Approach may be extended in case of situation wherein signal crosses from one power domain to another with different multi-rail voltage connection specified in initial/final identifiers. Parsing and inference step can detect signal connection that involves two or more sections. In such situation, one or more cells can be created and inserted on the signal. Such inserted cell carries inference function as above and performs tasks/methods to transport logic signal from one domain to another based on circuit characteristics specified in respective rail design object description. One example of such cell is level shifter to transport signal from 3.3 v domain to 5 v domain. Further, polymorphic function can be embedded into inserted cell, with cell being modeled as design object in accordance with references above. Such polymorphic function may behave in similar fashion to polymorphic functions of rail objects described above. Benefit to user is that design, phases or tool objects and processes that interact with this cell or process this cell can perform different operations. Without loss of generality, this approach can be extended to any object in the pool.

It is noted that some or all rail types may not be explicitly declared, even if used as such. One or more rails may be derived from existing logic structure of the design. This approach is applicable to such a model of usage.

Figure 5:
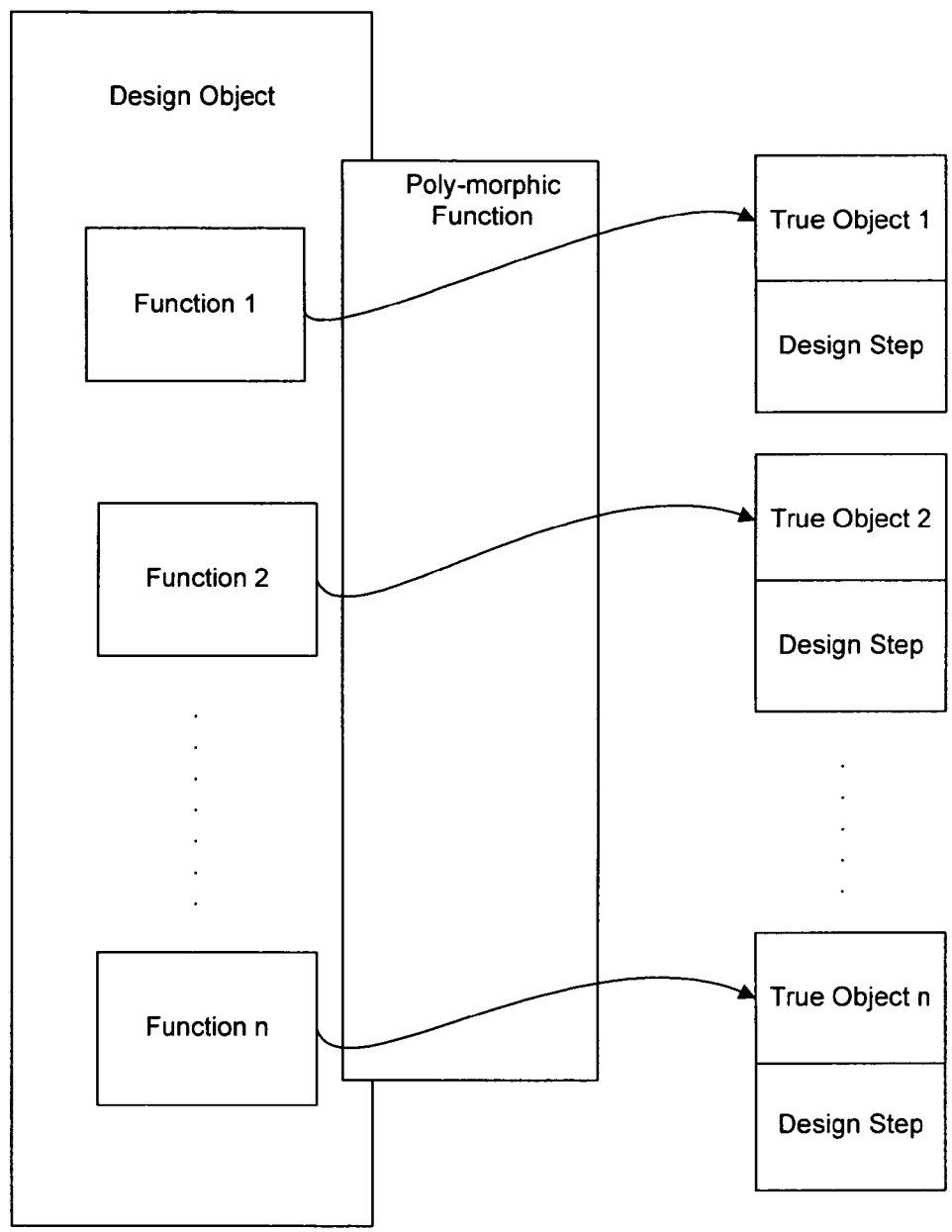
FIG. 5 is block diagram showing example object relationships using poly morphic function.

FIG. 5 block diagram shows example object relationships using polymorphic function. As shown design object block comprises one or more particular design object functions coupled via polymorphic function module to one or more true object data structure or modules. Polymorphic function may operate automatically or manually as functional or table look-up for enabling design-true object corresponding association or functional coupling.

Optionally design object functionality depends on one or more state, function, condition or other attribute pertaining to one or more true object, such functionality being obtained via real-time calculation, for example based on device carrier modeling, or pre-determined value look-up from object-oriented or relational database. Thus when one or more design step (e.g., simulation) operates, such step may or may not be aware of underlying polymorphic relationship between one or more true object and one or more design object functionality.

Alternatively visualizer software tool may be employed to partition or select one or more multi-voltage islands, and auto-generate modified design files (e.g., verilog) or display signal waveform to represent one or more voltage parameter change for one or more specified netlist schematic, thus representing operational signaling or logical behavior change due to one or more voltage applied change. Additionally voltage rule analyzer or checker tool may provide one or more alert (e.g., poor tri-state condition) for example according to voltage or frequency change; also testability scan vectors may be applied to design for further verification.

We claim:

1. An automated design methodology for designing electronic circuits with one or more power domains, the methodology comprising:
   creating, by using one or more computers, a design file that describes an implementation of a design using a hardware descriptive language;
   defining in the design file a section associated with a power domain, by:
     inserting in the design file an initial identifier that specifies the power domain and which begins the section associated with the power domain;
     inserting in the design file a final identifier associated with the initial identifier to end the section associated with the power domain; and
     instantiating between the initial identifier and the final identifier a component coupled to the power domain.

2. The automated design methodology of claim 1, wherein the section associated with the power domain contains instantiations of all components coupled to voltage rails associated with the power domain.

3. The automated design methodology of claim 1 further comprising the step of:
   parsing the design file to create one or more design objects for each component in a section of the design file.

4. The automated design methodology of claim 3 wherein each design object comprises one or more rail connections.

5. The automated design methodology of claim 3 wherein the design objects are created in an object pool comprising a plurality of rail design objects, a plurality of library objects, and a plurality of tool objects.

6. The automated design methodology of claim 5 wherein each of the plurality of rail design objects comprises one or more polymorphic function elements,
   wherein a polymorphic function element may be called upon to execute a different action depending on a specific step in a design process.

7. The automated design methodology of claim 6, wherein one or more polymorphic function elements are user-customizable.

8. The automated design methodology of claim 5 wherein each of the plurality of library objects comprises one or more polymorphic function elements,
   wherein polymorphic function elements may be called upon to execute one or more different actions depending on a specific step in a design process.

9. The automated design methodology of claim 8, wherein one or more polymorphic function elements are user-customizable.

10. The automated design methodology of claim 5 wherein each of the plurality of tool objects comprises one or more polymorphic function elements,
    wherein the polymorphic function elements of each tool object are coupled to the polymorphic function elements of each rail design object and library object, and wherein the polymorphic function elements may be called upon to execute one or more different actions depending on a specific tool object invoked by a specific step in a design process.

11. The automated design methodology of claim 10 wherein the polymorphic function elements are user-customizable.

12. The automated design methodology of claim 3 further comprising the steps of:
    parsing each design object to create one or more signals;
    detecting a signal being present in a plurality of sections; and
    creating one or more cells coupled to the design objects associated with the signal, wherein each of the cells transports a logic function of the signal to one or more components represented by the design objects associated with the signal.

13. The automated design methodology of claim 12 further comprising the steps of:
    creating a design object according to each of the cells,
    wherein each design object comprises one or more polymorphic function elements, the polymorphic function elements being called upon to execute one or more different action depending on a specific design process step in the automated design methodology.

14. The automated design methodology of claim 13 wherein the polymorphic function elements is user-customizable.

15. The automated design methodology of claim 1 wherein the one or more voltage rails comprise power supply voltage, ground, body bias voltage, sleep voltage and retention voltage or other rails which may be extended by software or user.

16. The automated design methodology of claim 1, wherein the initial identifier corresponding to the power domain specifies the power domain by including a name for each rail coupled to the component.

* * * * *